(12) United States Patent
Fuge

(10) Patent No.: US 7,285,935 B2
(45) Date of Patent: Oct. 23, 2007

(54) BATTERY LIFE DETERMINATION

(75) Inventor: Jonathan P Fuge, Bristol (GB)

(73) Assignee: Renishaw PLC, Gloucestershire (GB)

( * ) Notice: Subject to any disclaimer, the term of this patent is extended or adjusted under 35 U.S.C. 154(b) by 268 days.

(21) Appl. No.: 10/793,879

(22) Filed: Mar. 8, 2004

(65) Prior Publication Data

US 2004/0178771 A1    Sep. 16, 2004

(30) Foreign Application Priority Data

Mar. 12, 2003  (GB) .............................. 0305655.3

(51) Int. Cl.
  *H01M 10/44*  (2006.01)
  *H01M 10/46*  (2006.01)
(52) U.S. Cl. ...................................... 320/132
(58) Field of Classification Search .............. 320/132, 320/149, DIG. 21; 324/426, 430, 433
See application file for complete search history.

(56) References Cited

U.S. PATENT DOCUMENTS

| 4,180,770 | A | 12/1979 | Eby |
| 4,678,998 | A | 7/1987 | Muramatsu |
| 5,130,699 | A | 7/1992 | Reher et al. |
| 5,703,467 | A | 12/1997 | Patino |
| 6,208,114 | B1 | 3/2001 | Jones et al. |
| 6,232,747 | B1 | 5/2001 | Takahashi et al. |
| 6,400,123 | B1 | 6/2002 | Bean et al. |
| 2003/0052690 | A1 * | 3/2003 | Shoch ........................ 324/433 |

FOREIGN PATENT DOCUMENTS

| DE | 195 39 492 A1 | 4/1997 |
| EP | 0 653.826 B1 | 2/1999 |
| FR | 2 561 391 A1 | 9/1985 |
| GB | 2 219 151 A | 11/1989 |
| GB | 2 239 567 A | 7/1991 |
| WO | WO 01/69273 A2 | 9/2001 |

* cited by examiner

*Primary Examiner*—Edward H Tso
(74) *Attorney, Agent, or Firm*—Oliff & Berridge, PLC

(57) ABSTRACT

A method and apparatus are disclosed for providing a battery low voltage warning for a range of batteries having various initial voltages. When a battery is inserted into a battery holder its initial off-load voltage is measured using a microprocessor. The microprocessor selects a suitable voltage threshold, at which the battery is considered to be discharged, from a predetermined number of voltage thresholds. The initial off-load voltage of the battery is used by the microprocessor as a basis for selecting a suitable threshold. An LED warning or the like is used to indicate that the threshold is reached in use. A measurement probe is shown which uses such a method and apparatus.

17 Claims, 3 Drawing Sheets

BATTERY LIFE DETERMINATION

FIELD OF THE INVENTION

This invention relates to the determination of the life of a voltaic cell, the initial potential difference of which is indeterminate, particularly but not exclusively, for use with measurement probes.

DESCRIPTION OF THE PRIOR ART

In order to improve the battery life of products higher capacity batteries need to be used. The battery compartment of a product will have been designed for a specific, often standard, size of battery (or batteries). When a user wants to replace a battery of a standard size the user can often select a battery from a number of batteries having a range of characteristics such as voltage, capacity, peak power all of which will fit into the compartment. Typically such a range can have various initial voltages dependent on the construction of the batteries used. Such a range can, to some extent, be predicted during the product's design, but it is difficult to estimate the life of a battery if its characteristics such as voltage, capacity, peak power are not known.

Where a "low battery power" warning is required it is a simple task to provide a voltage threshold switch in a circuit (e.g. a Zener diode circuit) which warns of a low voltage. However, such a switch is not accurate and will not work if the product is used with a battery having a different initial voltage to the battery voltage for which the switch was designed. Setting such a switch to a voltage which is higher than absolutely necessary will result in changing batteries when there is no need to do so.

SUMMARY OF THE INVENTION

There is a commercial advantage to providing a product e.g. a high value product which may last for many years such as a measurement probe sold under the trade mark "RENISHAW", that can have a multitude of battery types fittable therein and can accommodate as yet unknown battery types as they are developed.

Desirably such a product will have a low battery warning so that optimum battery life can be obtained but the warning must work even when batteries of varying initial voltages are used with the product.

According to a first aspect the present invention provides a battery low voltage warning comprising the steps of:
electrically connecting a battery having at least one voltaic cell to a battery holder;
measuring the initial off-load voltage of the at least one voltaic cell; and
determining a suitable voltage threshold at which the at least one cell is considered to be discharged, dependent on the initial off-load voltage; and
providing a warning when that threshold is reached.

Thus an initial voltage which will depend on the type and number of cells used can be determined and an appropriate minimum voltage can be set initially. This enables any battery or batteries to be fitted to a product and the appropriate low voltage warning can be set to indicate that the battery is e.g. almost fully discharged.

Preferably the step of determining a suitable voltage threshold at which the at least one cell is considered to be discharged includes selecting an appropriate predetermined voltage threshold from a plurality of such voltage thresholds dependent on the measured initial off-load voltage.

Preferably the method provides the further step of determining the initial state of the at least one cell by load testing the cell and measuring the cell voltage during the load test.

Preferably the step of determining the initial state of the at least one cell includes accepting the battery if the difference in the measured initial cell voltage and the cell voltage measured during the load test is less than a predetermined amount.

Such a load test will cause rejection of a battery if the difference between off-load and loaded voltage exceeds about 10%. If the difference is within about 10% then the battery is considered to be healthy.

Preferably the load test is performed after the off-load voltage determination.

Preferably the method above employs a microprocessor and an algorithm for carrying out the steps.

More preferably if the off-load test reveals a voltage which is within a predetermined range a programming mode is entered. Such a method allows programming the algorithm of the microprocessor upon insertion of a special battery.

The invention extends to apparatus for carrying out the method.

According to a second aspect the invention provides apparatus for providing a battery low voltage warning comprising:
a battery holder into which a battery is insertable, the battery comprising at least one voltaic cell;
a voltage measuring device electrically connected to the at least one voltaic cell when the battery is inserted in the holder, and providing a measure of the initial off-load voltage of the at least one voltaic cell; and
a device determining a suitable voltage threshold at which the at least one cell is considered to be discharged, dependent on the off-load voltage measured by the voltage measuring device;
a warning device providing a warning when that threshold is reached.

According to a third aspect the invention provides a measurement probe having apparatus for providing a battery low voltage warning comprising:
a battery holder into which a battery is insertable, the battery comprising at least one voltaic cell;
a voltage measuring device electrically connected to the at least one voltaic cell when the battery is inserted in the holder, and providing a measure of the initial off-load voltage of the at least one voltaic cell; and a device determining a suitable voltage threshold at which the at least one cell is considered to be discharged, dependent on the off-load voltage measured by the voltage measuring device; and
a warning device providing a warning when that threshold is reached.

BRIEF DESCRIPTION OF THE DRAWINGS

An embodiment of the invention is described in detail below with reference to the drawings, wherein.

DESCRIPTION OF THE PREFERRED EMBODIMENTS

Figure 1:
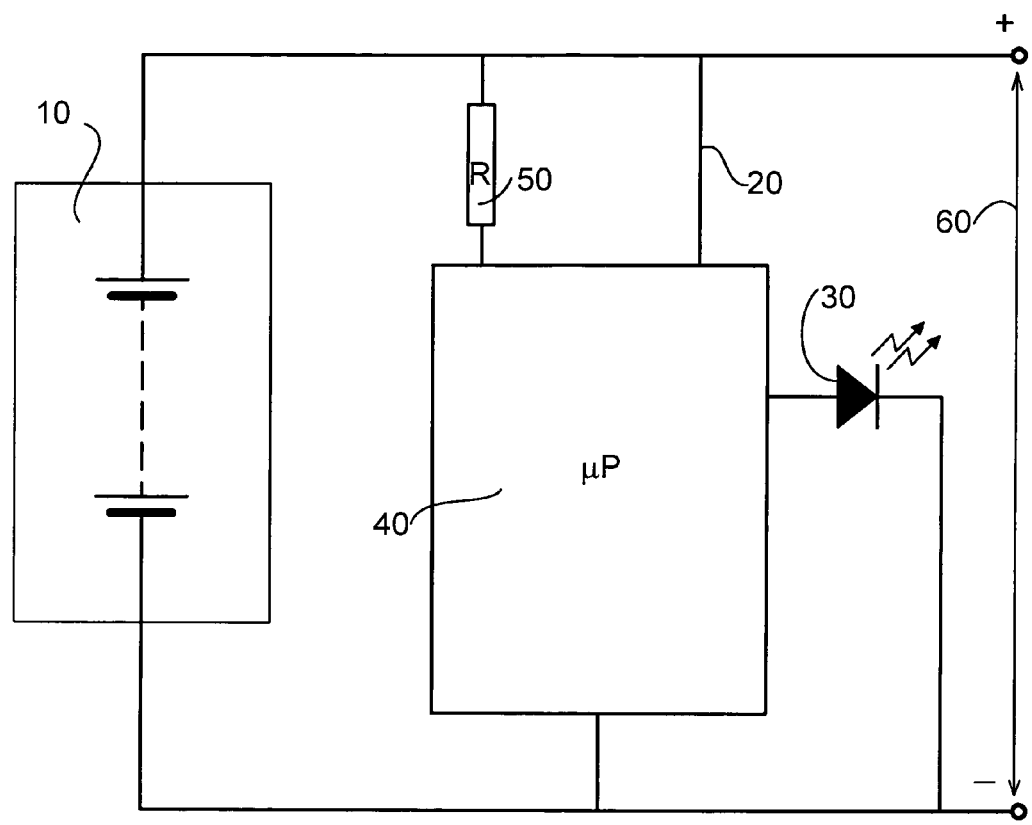
FIG. 1 shows a schematic circuit for the invention.

Referring to FIG. 1, there is shown a circuit for supplying a potential difference across output terminals + and −. The battery compartment 10 is of a size which accepts, in this instance, two AA size batteries. In use numerous combinations of batteries can be inserted into the compartment. The following table shows examples of battery combinations presently available that could be inserted.

| TYPE | CELL VOLTAGE | NUMBER OF CELLS | TOTAL VOLTAGE |
|---|---|---|---|
| Lithium Manganese | 3 | 2 × AA | 6 |
| Lithium Manganese | 3 | 4 × ½AA | 12 |
| Lithium Thionyl Chloride | 3.6 | 2 × AA | 7.2 |
| Lithium Thionyl Chloride | 3.6 | 4 × ½AA | 14.4 |
| Lithium Iron Disulphide | 1.8 | 2 × AA | 3.6 |
| Alkaline | 1.5 | 2 × AA | 3 |
| Nickel Cadmium | 1.2 | 2 × AA | 2.4 |
| Nickel Metal Hydride | 1.2 | 2 × AA | 2.4 |

It can be seen that voltages ranging from 2.4 to 14.4 volts are possible, using the selection of batteries shown in the table above. It is desirable to be able to use at least this range of batteries so that the customer has a choice. The customer may have a limited selection of batteries that he/she can obtain so it is advantageous that any battery voltage can be used. Such a choice has a disadvantage that it is difficult to set a low battery voltage threshold. The circuit shown in FIG. 1 is able to set a correct low battery threshold with various input voltages.

Figure 2:
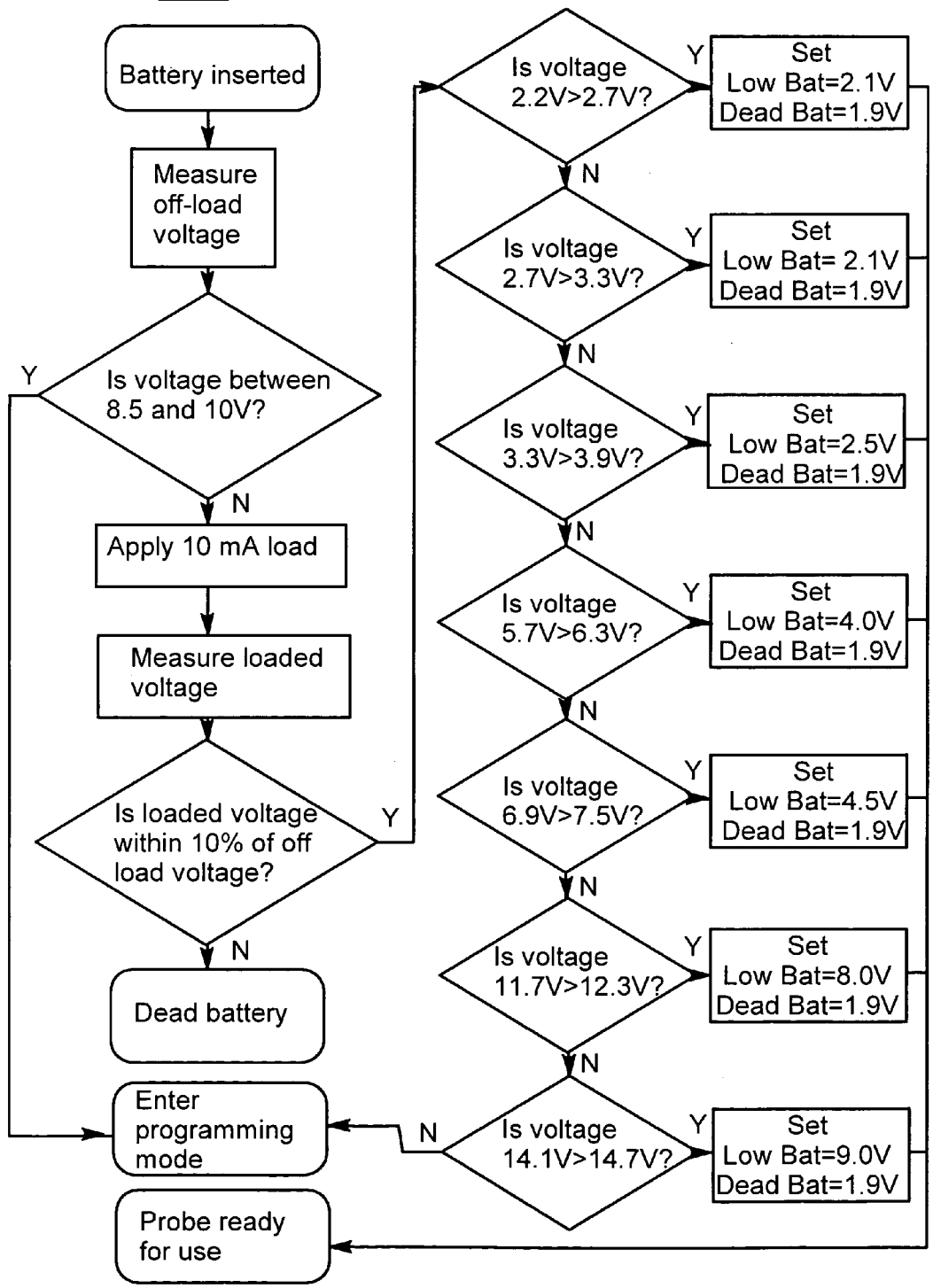
FIG. 2 shows a flow diagram for understanding the invention.

The circuit has a microprocessor 40 connected to the output of the battery compartment 10 via line 20. The microprocessor operates as described below with reference to FIG. 2. At insertion of the batteries the microprocessor measures the initial off-load voltage of the fresh batteries. In order to detect weak batteries a load, 10 mA in this instance, is then applied to the batteries via a resistance 50. If the initial off-load voltage across the batteries drops by more than 10% then the batteries are considered to be weak and not suitable for use. If the batteries are acceptable then the initial off-load voltage is used to set the threshold according to the flow diagram shown in FIG. 2.

For example if the initial off-load battery voltage in an acceptable battery is between 2.2 volts and 2.7 volts then a low battery threshold is set to 2.1 volts and a threshold for a completely discharged battery is set at 1.9 volts.

If a higher initial off-load voltage is detected the microprocessor will follow the steps shown in the flow diagram until the initial off-load voltage is within one of the voltage ranges shown in the diagram. The appropriate voltage thresholds for low battery voltage and dead (completely discharged) voltage can then be set. The probe becomes ready for use after the voltage thresholds have been set.

In the circuit of FIG. 1 a warning LED 30 is powered by the microprocessor when the low battery voltage is reached. Other visible or audible warnings are possible.

In the event that the initial off-load battery voltage is not within one of the ranges shown in the flow diagram then the microprocessor may enter a programming mode at which the user can manually enter the details of the low battery and dead battery thresholds. Such an occurrence may be possible if an unknown battery type is inserted into the battery compartment 10. There is also a factory test facility whereby if the initial off-load voltage is between 8.5 and 10 volts (not a voltage available from any known battery type) then the programming mode is entered for factory test purposes. The programming mode can be exited by removing power from the probe and then re-applying it at a voltage within one of the standard operating ranges.

In another embodiment a modification to the above probe is made. The characteristics of Lithium Thionyl Chloride (LiThCh) batteries provide an almost constant voltage, dropping very rapidly at the end of their life. As a consequence it is difficult to provide a low battery warning period before the LiThCh battery drops to a dead state. So if an initial off-load voltage detected by the microprocessor is of a value which indicates that a LiThCh battery (3.6 volts or even multiples thereof) then a usage timer is started and the low battery warning is given when the end of the useful life of the battery is close.

Figure 3:
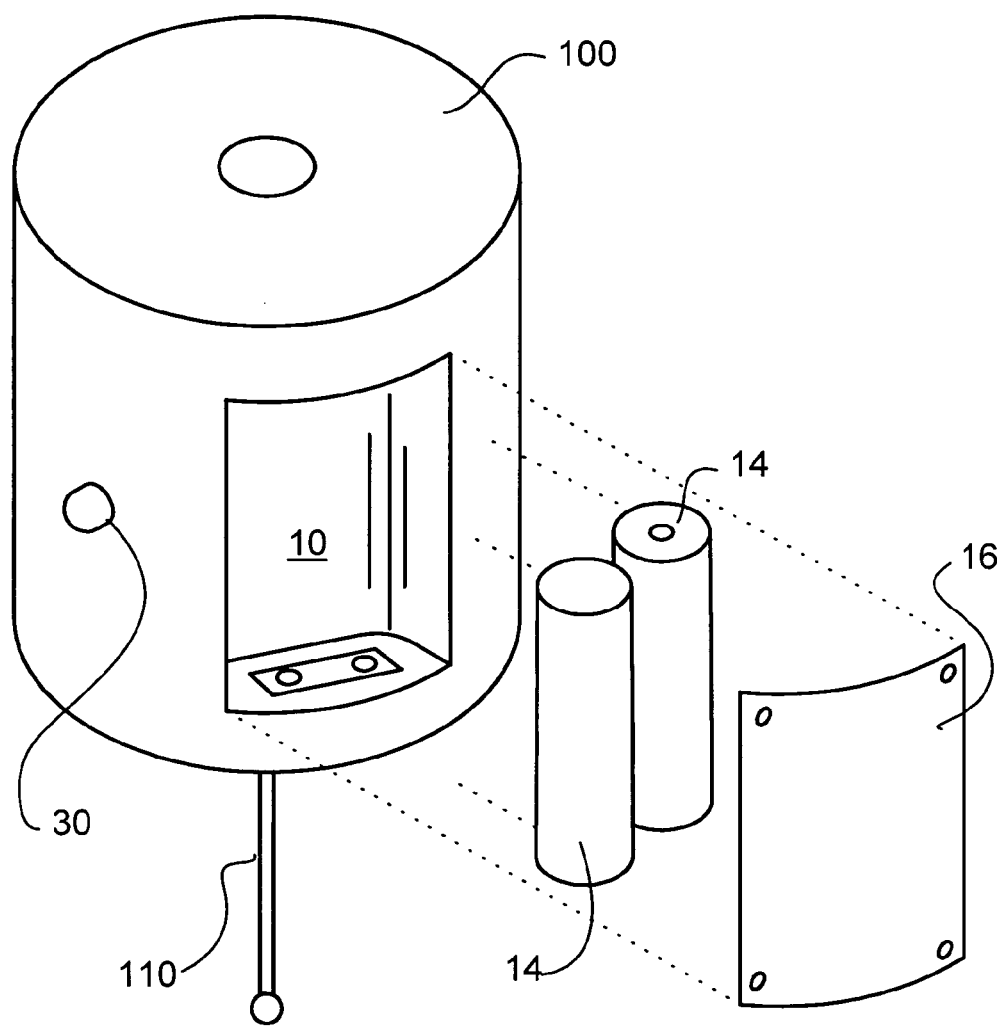
FIG. 3 shows a measurement probe according to the invention.

FIG. 3 shows a probe 100 for determining dimensions. Stylus 110 is used in contact with an article the dimensions of which need to be found. The probe has a battery compartment in the form of holder 10 for accommodating two AA batteries 14.

The holder 10 is closed by a cover 16 in turn held in place by screws.

The circuit components shown in FIG. 1 are, in this instance, within the probe 100.

The probe can be used with a large range of batteries all of which can be used to full capacity before a warning of replacement is necessary.

Modifications of the above embodiment are envisaged. For example, the types of batteries, their size, voltages and thresholds may be different from those in the embodiment described. The values of the load test may be altered to suit the battery type. The flow diagram of FIG. 2 may be modified to suit different battery types. The term battery embraces all potential difference stores including capacitive, chemical and mechanical. Primary and secondary cells, single or stacked are embraced by the term battery (or batteries).

The term "low battery" embraces dead or low capacity batteries. For example a warning could occur when a battery has only enough capacity for another week's or day's operation. The warning could be any change in a condition e.g. a light or signal turning on or off. Additionally a warning could be sent to a remote location e.g. the control screen of a machine tool or to a battery ordering point.

The invention claimed is:

1. A method for providing a battery low voltage warning comprising the steps of:
   electrically connecting a battery having at least one voltaic cell to a battery holder;
   measuring an off-load voltage of the at least one voltaic cell; and
   determining a suitable voltage threshold, only from the off-load voltage, at which the at least one voltaic cell is considered to be discharged; and
   providing a warning when that threshold is reached.

2. A method for providing a battery low voltage warning as claimed in claim 1 wherein the step of determining a suitable voltage threshold at which the at least one voltaic cell is considered to be discharged includes selecting an appropriate predetermined voltage threshold from a plurality of such voltage thresholds dependent on the measured off-load voltage.

3. A method for providing a battery low voltage warning as claimed in claim 1 wherein the method provides the further step of determining the a state of the at least one voltaic cell by load testing the voltaic cell and measuring the voltaic cell voltage during the load test.

4. A method for providing a battery low voltage warning as claimed in claim 3 wherein the step of determining the state of the at least one voltaic cell includes accepting the battery if a difference in the measured cell voltage and the voltaic cell voltage measured during the load test is less than a predetermined amount.

5. A method for providing a battery low voltage warning as claimed in claim 4 wherein the predetermined amount is about 10%.

6. A method for providing a battery low voltage warning as claimed in claim 4 wherein the step of determining the state of the at least one voltaic cell by load testing the voltaic cell is performed after the step of measuring the off-load voltage of the voltaic cell.

7. A method for providing a battery low voltage warning as claimed in claim 1 employing a microprocessor and an algorithm for carrying out the steps.

8. A method for providing a battery low voltage warning as claimed in claim 7 wherein the method provides the further step of entering a microprocessor programming mode for altering the algorithm if the measured off-load voltage falls within a predetermined range.

9. A method for providing a battery low voltage warning as claimed in claim 1 wherein every time the step of electrically connecting a battery to a battery holder is carried out, the other steps of claim 1 are repeated.

10. Apparatus for providing a battery low voltage warning comprising:
   a battery holder into which a battery is insertable, the battery comprising at least one voltaic cell;
   a voltage measuring device electrically connected to the at least one voltaic cell when the battery is inserted in the holder, and providing a measure of the off-load voltage of the at least one voltaic cell;
   a device determining the suitable voltage threshold at which the at least one voltaic cell is considered to be discharged, dependent only on the off-load voltage measured by the voltage measuring device; and
   a warning device providing a warning when that threshold is reached.

11. Apparatus for providing a battery low voltage warning as claimed in claim 10 wherein the device for determining a suitable voltage threshold selects an appropriate predetermined voltage threshold from a plurality of such voltage thresholds dependent on the measured off-load voltage.

12. Apparatus for providing a battery low voltage warning as claimed in claim 10 further comprising:
   a load testing device which measures the voltage of the at least one voltaic cell when the voltaic cell is subjected to an electrical load.

13. Apparatus for providing a battery low voltage warning as claimed in claim 12 wherein the load testing device is operative such that the battery is accepted if a difference in the measured voltage of the at least one voltaic cell and the at least one voltaic cell voltage measured during the load test is less than a predetermined amount.

14. Apparatus for providing a battery low voltage warning as claimed in claim 13 wherein the predetermined amount is about 10%.

15. Apparatus for providing a battery low voltage warning as claimed in claim 10 wherein the voltage measuring device providing a measure of the off-load voltage of the at least one voltaic cell, the device determining a suitable voltage threshold at which the at least one voltaic cell is considered to be discharged, and the load testing device comprise a microprocessor having an algorithm performing the function of the said devices.

16. Apparatus for providing a battery low voltage warning as claimed in claim 15 wherein the algorithm is reprogrammable when the off-load voltage is measured to be within a predetermined range.

17. A measurement probe having apparatus for providing a battery low voltage warning comprising:
   a battery holder into which a battery is insertable, the battery comprising at least one voltaic cell;
   a voltage measuring device electrically connected to the at least one voltaic cell when the battery is inserted in the holder, and providing a measure of the off-load voltage of the at least one voltaic cell;
   a device determining a suitable voltage threshold at which the at least one voltaic cell is considered to be discharged, dependent only on the off-load voltage measured by the voltage measuring device; and
   a warning device providing a warning when that the suitable voltage threshold is reached.

* * * * *